United States Patent
Lin

(10) Patent No.: US 10,547,161 B1
(45) Date of Patent: Jan. 28, 2020

(54) PARALLEL CONNECTED MULTIPLE POWER SUPPLY CABINET

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

(*) Notice: Subject to any disclaimer, the term of this patent is extended or adjusted under 35 U.S.C. 154(b) by 0 days.

(21) Appl. No.: 16/126,249

(22) Filed: Sep. 10, 2018

(51) Int. Cl.
*H02B 1/30* (2006.01)

(52) U.S. Cl.
CPC .................. *H02B 1/305* (2013.01)

(58) Field of Classification Search
CPC ........................................ H02B 1/305
See application file for complete search history.

(56) References Cited

U.S. PATENT DOCUMENTS

2014/0268947 A1* 9/2014 Phadke .............. H02J 1/102
363/69
2017/0108899 A1* 4/2017 Thul .............. H05K 7/1457

OTHER PUBLICATIONS

U.S. Appl. No. 15/694,182, filed Aug. 28, 2018, Chyng Hong Electronic Co., Lt.

* cited by examiner

Primary Examiner — Fritz M Fleming
(74) Attorney, Agent, or Firm — Sinorica, LLC

(57) ABSTRACT

The present invention discloses a parallel connected power supply cabinet system which comprises a plurality of power supply cabinets electrically parallel connected. The power supply cabinet comprises a frame with a plurality of installation chambers formed from the top of the frame downwardly to the bottom of the same. A power distribution unit is installed in one of the installation chambers near the top of the frame. A plurality of power supply units installed in the rest of the chambers respectively. The power distribution unit controls the input power of the power supply cabinet.

7 Claims, 5 Drawing Sheets

PARALLEL CONNECTED MULTIPLE POWER SUPPLY CABINET

BACKGROUND OF THE INVENTION

Field of the Invention

The present invention relates to a parallel connected multiple power supply cabinet.

Brief Description of the Prior Art

It has been noted that a single unit of power supply has been commonly used in a factory for providing electric signals to test the manufactured electrical appliance. It is necessary to adjust each of the power supply unit for a different use of test. It is not economic and very much time consuming in adjusting the power supply for the need of test.

Therefore, a conventional electric power distribution system will be used to include a programmable power distribution unit. One of this kind of programmable power distribution unit can be referred in a patent application Ser. No. 15/694,182 with a filing date of Sep. 1, 2017 by the current applicant.

Although an electric power distribution unit has been used but it was still necessary to switch and/or adjust each of the power supply unit to fit the test purpose. The wiring among different power supply units has been complex and difficult and even cause to attenuate the testing signal. The quality of the output signals is poor and in need of improvement.

SUMMARY OF THE INVENTION

It is therefore the principle object of the present invention is to provide a parallel connected multiple power supply cabinet for providing a power signal with high quality.

Another object of the present invention is to provide a parallel connected multiple power supply cabinet having a main programmable power distribution unit to manage the ON-OFF of each power supply unit.

An important advantage of the present invention is to provide a power distribution unit to control the ON-OFF of the related power supply unit. Over current will be strictly controlled and/or obviated to maintain the quality of inspected signals.

A feature of the parallel connected multiple power supply cabinet according to the present invention is all the power supply units being electrically parallel connected resulting a best mode of power output.

The most important feature of the present invention is to provide a parallel connected multiple power supply cabinet having a plurality of power supply units installed in each of the cabinet. The multiple power supply cabinets are parallel connected.

In summary, a parallel connected power supply cabinet system comprising a plurality of power supply cabinets electrically parallel connected, each of the power supply cabinet comprises a frame with a plurality of installation chambers formed from the top of the frame downwardly to the bottom of the frame, a power distribution unit installed in one of the installation chambers near the top of the frame, and a plurality of power supply units installed in the rest of the chambers respectively. The power distribution unit controls the input power of the power supply cabinet.

BRIEF DESCRIPTION OF THE DRAWINGS

Those and other advantages, objectives and features of the high torque ratchet wrench, in accordance with the present invention, will become more apparent from the below detailed description of the preferred embodiments with reference the accompanying drawings, wherein.

DETAILED DESCRIPTION OF THE PREFERRED EMBODIMENT

Figure 1:
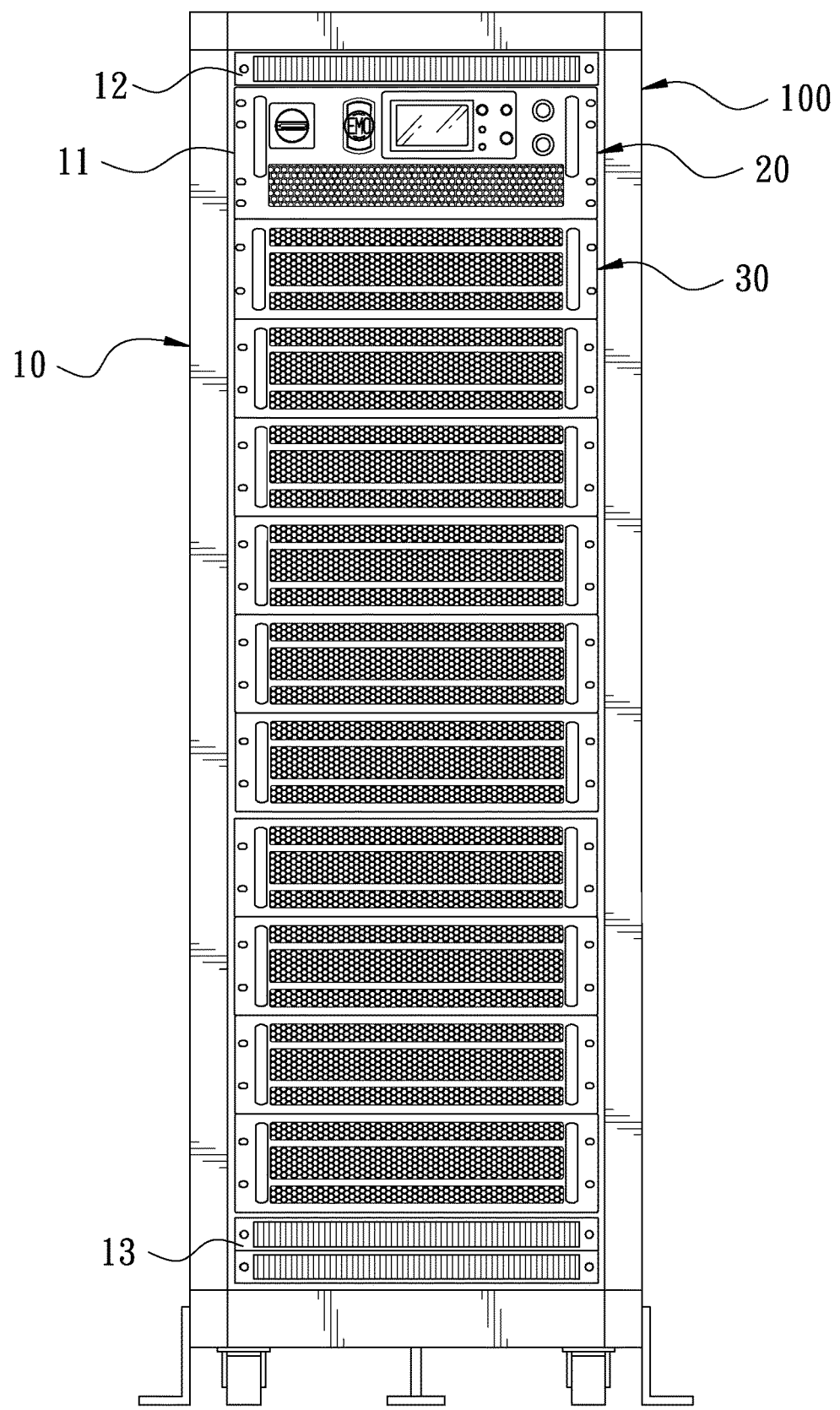
FIG. 1 is a perspective view of parallel connected multiple power supply cabinet.

Referring to FIG. 1 which shows a perspective view of a parallel connected multiple power supply cabinet. The power supply cabinet 100 comprises a frame 10 which is formed with a plurality of chambers 11 for the installation of power supply unit 30. In the embodiment shown in FIG. 1, the frame 10 comprises eleven chambers. At the top and bottom of the frame 10, there are formed wire slots 12 and 13 for containing the wires. A power distribution unit 20 is installed in the upper most chamber 11. The power distribution unit 20 is electrically connected to the power supply unit 30 to control the ON-OFF of the switch of each power supply unit 30. Each of the power unit 30 is parallel electrically connected. The upper most power supply unit 30 will act as a main power supply and the rest power supply unit will be controlled by the power distribution unit 20 through the main power supply.

Figure 2:
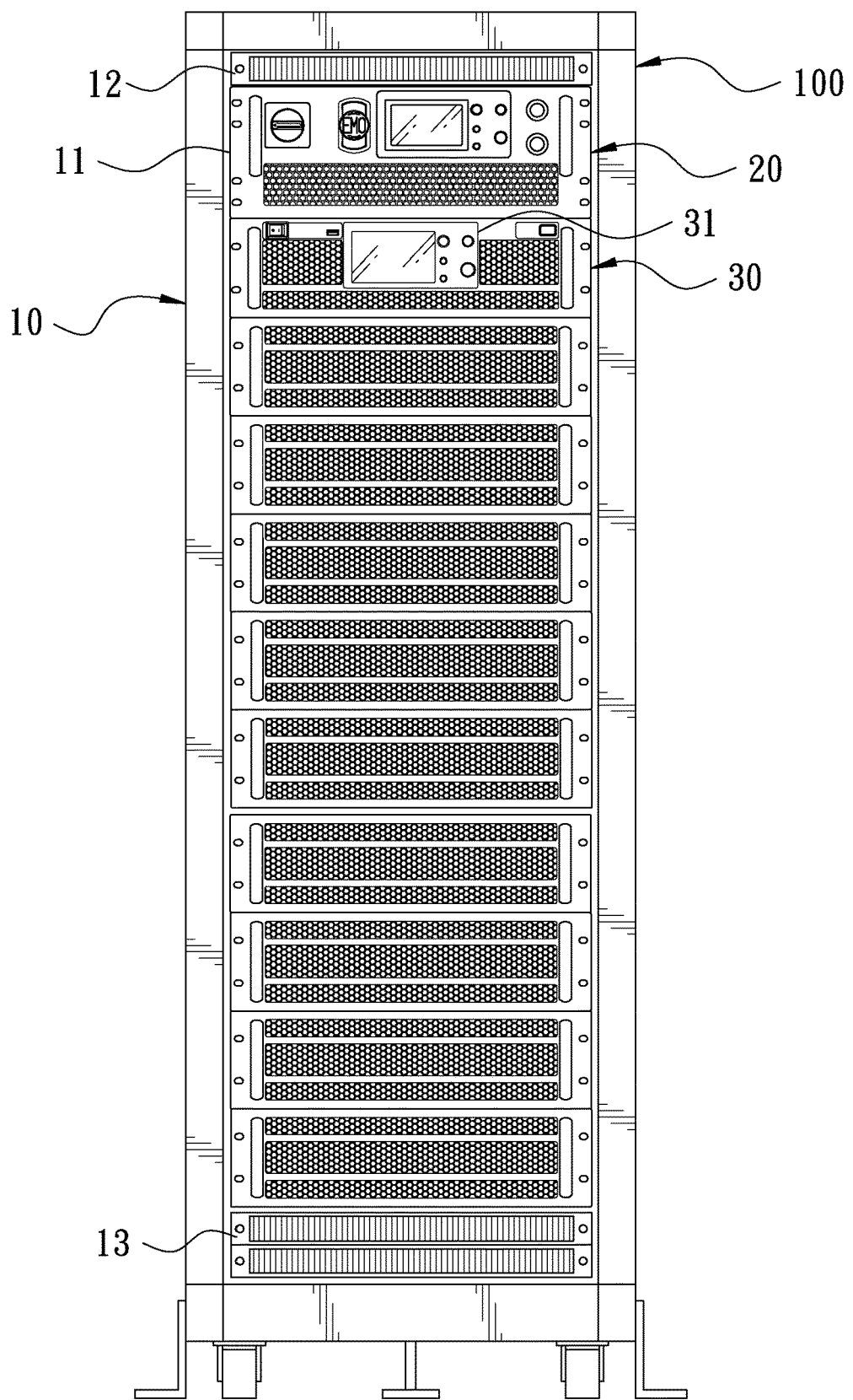
FIG. 2 is a perspective view of parallel connected multiple power supply cabinet having a power supply with an operation panel.

The operation of the power supply can be carried out through a panel 31 equipped on the main power supply unit 30. This is illustrated as the embodiment shown in FIG. 2.

Figure 3:
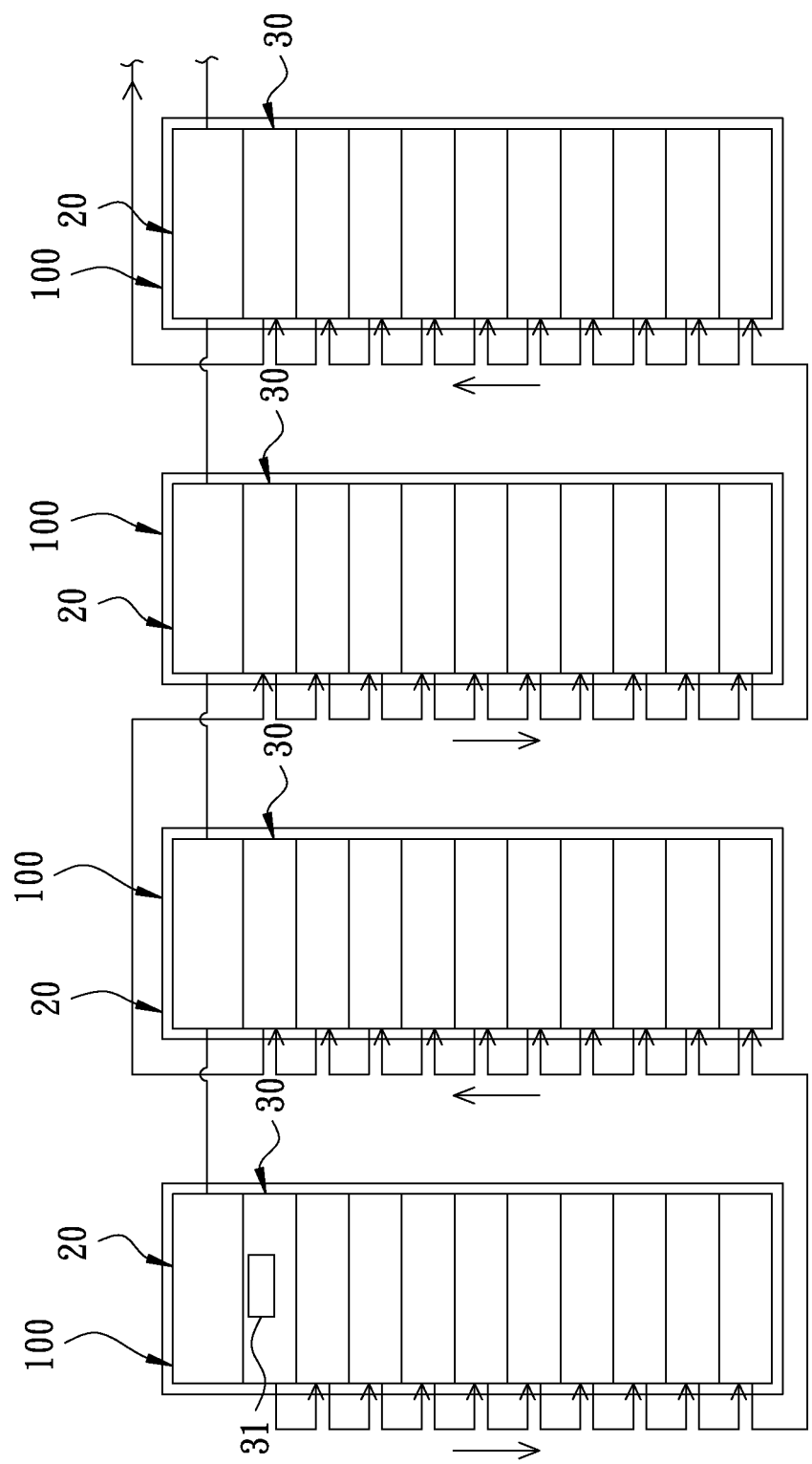
FIG. 3 is an illustrative view of multiple power supply cabinets electrically parallel connected.

Referring to FIG. 3 which is an illustrative view of multiple power supply cabinets electrically parallel connected. There are four parallel connected power supply cabinets 100 shown in this embodiment. The power signal will be generated and transmitted from the top power supply unit 30 downwardly to the lower most one of the power supply unit. The power signal will then be transmitted to the lower most power supply unit 30 at the adjacent power supply cabinet 100. Again, the power signal will be transmitted to the top most power supply unit 30 and fed to the adjacent power supply cabinet 100.

In the embodiment shown in FIG. 3, one can easily understand the generated power voltage can be inspected by the power distribution unit 20 equipped in each of the parallel connected power supply cabinet 100. The quality of the generated and transmitted voltage signal will be monitored by the most remote power distribution unit 20. Therefore, all the power supply units 30 will be checked to its power factor, power consumption etc. And with a pre-programmed power distribution, over current will be obviated and all the checking data can be fed back and stored appropriately. Obviously, the path is shortest of power signal transmission from the lowest power supply unit to the same of the adjacent power supply cabinet. Connection of electrical wire between power supply cabinets becomes very simple.

From the embodiment of the parallel connected power supply cabinet, particularly shown in FIG. 3, the power distribution unit 20 in each of the power supply cabinet 100 are electrically serial connected. Once on an emergency situation, the user can switch OFF either one of the power distribution unit 20. The corresponding main power supply unit 30 shall be switched OFF resulting an effective maintenance of the entire power supply system. In a practice of the embodiment according to the present invention, each power supply unit 30 has a maximum output of 15 kW making each power supply cabinet 100 having an output power of 150 kW. In addition, power supply unit 30 are piled up with a height of 30 U (1 U=1.75 inch or 44.45 milli meter).

Figure 4:
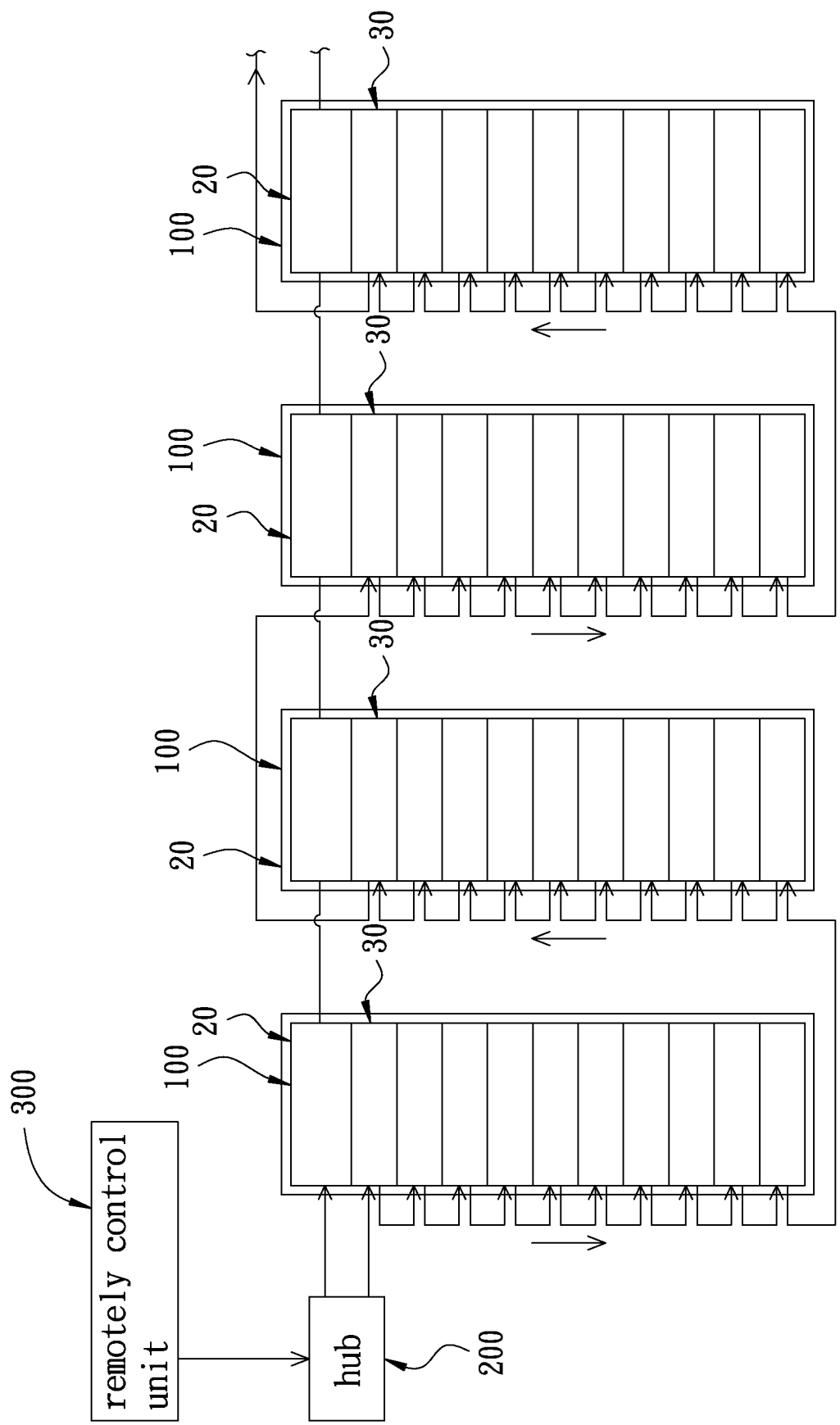
FIG. 4 is an illustrative view of a multiple parallel connected cabinet with a main power supply unit connected with a remotely control unit.
Figure 5:
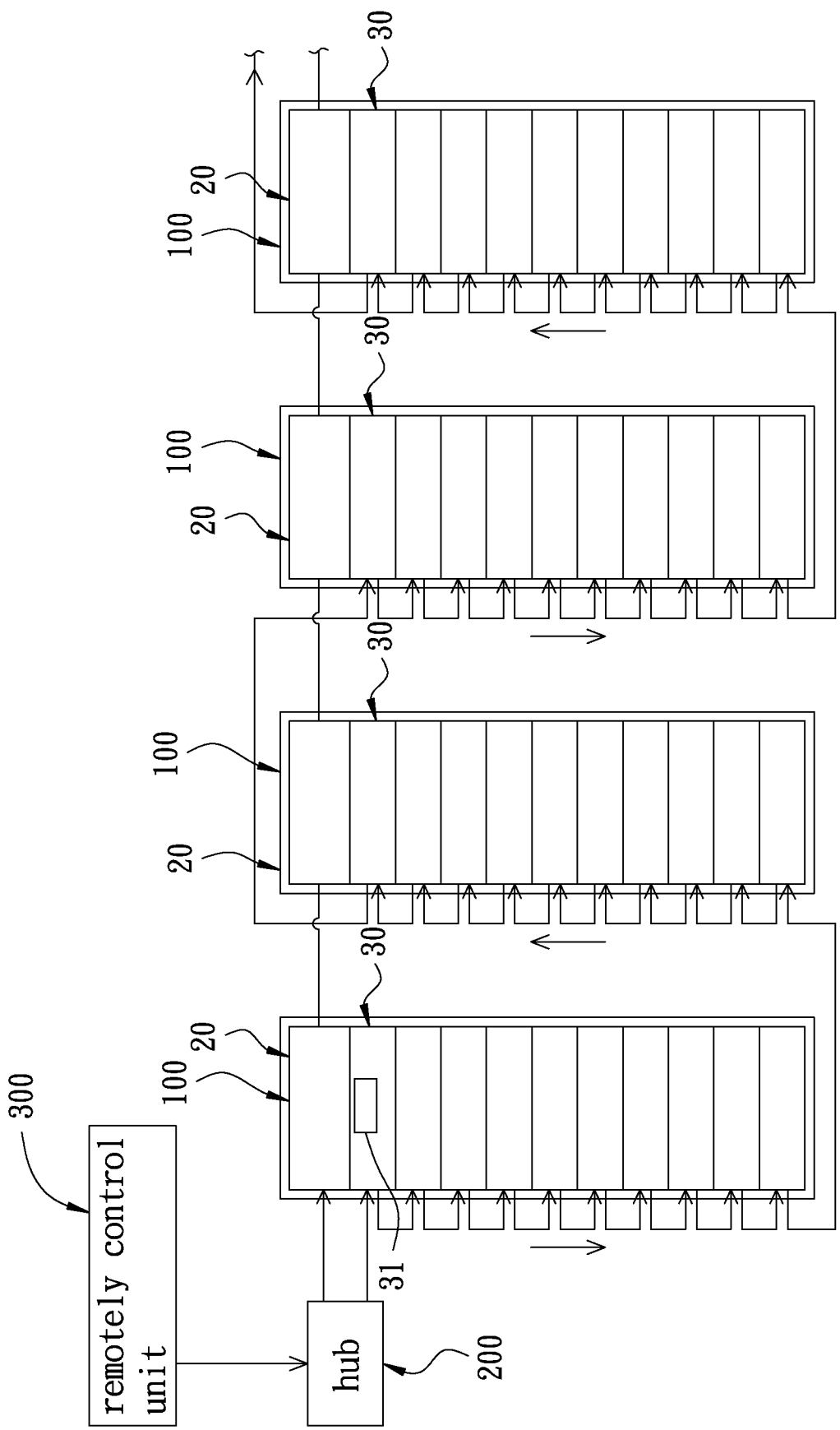
FIG. 5 is an illustrative view of a multiple parallel connected cabinet with a main power supply unit having an operation panel.

Referring to FIGS. 4 and 5, a further embodiment of the parallel connected power supply cabinet is shown. The power distribution unit 20 and the main power supply unit 30 can be electrically connected to a with a hub 200 and a remotely control unit 300. It will allow a remote control of ON-OFF of the entire parallel connected power supply cabinet system. With this arrangement, multiple testing terminals can be connected and operated simultaneously to result the desired data.

Although the parallel connected multiple power supply cabinet of the present invention has been described in way of preferred embodiment, it is apparent and readily understood that various changes, improvement and modifications can still be made without departing from the spirit of the invention and shall be fallen in the protection scope as the Claims in the present invention.

What is claimed is:

1. A parallel connected power supply cabinet system comprising a plurality of power supply cabinets electrically parallel connected wherein:

each of said power supply cabinet comprises a frame with a plurality of installation chambers formed from the top of said frame downwardly to the bottom of said frame;

a power distribution unit being installed in one of said installation chambers near the top of said frame; and a plurality of power supply units installed in the rest of said chambers respectively;

whereby said power distribution unit controls the input power of the power supply cabinet.

2. A parallel connected power supply cabinet system as claimed in claim 1 wherein said plurality of power supply cabinets being distributed opposing with each other; one of said power supply units installed below and next to said power distribution unit being active and operated as a main power supply unit.

3. A parallel connected power supply cabinet system as claimed in claim 2 wherein said main power supply unit further comprising an operation panel.

4. A parallel connected power supply cabinet system as claimed in claim 2 where said main power supply unit further comprising a hub which being in turn connected to a remotely control unit.

5. A parallel connected power supply cabinet system as claimed in claim 1 wherein said plurality of power supply units being electrically parallel connected.

6. A parallel connected power supply cabinet system as claimed in claim 1 wherein the lowest power supply unit being electrically connected to an adjacent power supply unit of an adjacent power supply cabinet to reduce the wiring distance of respective power supply cabinet.

7. A parallel connected power supply cabinet system as claimed in claim 1 wherein said frame of said power supply cabinet further comprising wire slots formed on the top and bottom of said frame of said power supply cabinet.

* * * * *